(12) United States Patent
Drab et al.

(10) Patent No.: US 9,224,768 B2
(45) Date of Patent: Dec. 29, 2015

(54) PIN DIODE STRUCTURE HAVING SURFACE CHARGE SUPPRESSION

(71) Applicant: Raytheon Company, Waltham, MA (US)

(72) Inventors: John J. Drab, Santa Barbara, CA (US); Justin Gordon Adams Wehner, Goleta, CA (US); Christian M. Boemler, Lompoc, CA (US)

(73) Assignee: Raytheon Company, Waltham, MA (US)

(*) Notice: Subject to any disclaimer, the term of this patent is extended or adjusted under 35 U.S.C. 154(b) by 32 days.

(21) Appl. No.: 13/959,081

(22) Filed: Aug. 5, 2013

(65) Prior Publication Data

US 2015/0035014 A1 Feb. 5, 2015

(51) Int. Cl.
*H01L 27/146* (2006.01)
*H01L 29/868* (2006.01)
*H01L 27/144* (2006.01)
*H01L 31/105* (2006.01)

(52) U.S. Cl.
CPC ...... *H01L 27/14605* (2013.01); *H01L 27/1446* (2013.01); *H01L 27/14649* (2013.01); *H01L 29/868* (2013.01); *H01L 31/105* (2013.01)

(58) Field of Classification Search
CPC ............ H01L 31/022416; H01L 31/105; H01L 31/107
See application file for complete search history.

(56) References Cited

U.S. PATENT DOCUMENTS

| 2004/0108516 | A1* | 6/2004 | Kang .......................... 257/184 |
| 2005/0017318 | A1 | 1/2005 | Ishida et al. |
| 2007/0090418 | A1 | 4/2007 | Fletcher et al. |
| 2007/0170436 | A1* | 7/2007 | Sugawara ..................... 257/77 |
| 2008/0308840 | A1 | 12/2008 | Ogura |
| 2010/0327387 | A1* | 12/2010 | Kasai et al. .................. 257/438 |
| 2012/0256304 | A1 | 10/2012 | Kaigawa |

OTHER PUBLICATIONS

Barry E. Burke, Stephanie A.Gajar, Dynamic Suppression of interface-State Dark Current in Buried-Channel CCD's, IEEE, vol. 38, No. 2, Feb. 1991, pp. 285-290.

N.S. Saks, A Technique for Suppressing Dark Current Generated by Interface States in Buried Channel CCD Imagers, IEEE, vol. EDL-1 No. 7, Jul. 1980, pp. 131-133.

J. Hynecek, Virtual Phase CCD Technology, IEEE, 1979, pp. 611-614.

Albert K. Henning, Effects of Semicoductor Surface Band Pinning on Scanning Electrostatic Force Microscopy, Redwood Microsystems, Inc., pp. 1-12.

Tetsuo Yamada, Haruo Okano, Nobudo Suzuki, The Evaluation of Buried-Channel Layer in BCCD's, IEEE, vol. ED-25, No. 5., May 1978. pp. 544-546.

(Continued)

*Primary Examiner* — Daniel Whalen

(74) *Attorney, Agent, or Firm* — Daly, Crowley, Mofford & Durkee, LLP

(57) ABSTRACT

A semiconductor structure having: a silicon structure; and a plurality of laterally spaced PiN diodes formed in the silicon structure; and a surface of the silicon structure configured to reduce reverse bias leakage current through the PiN diodes. In one embodiment, a gate electrode structures is disposed on a surface of the silicon structure, the gate electrode structure having portions disposed between adjacent pairs of the diodes, the gate structure being biased to prevent leakage current through the diodes.

4 Claims, 2 Drawing Sheets

(56) References Cited

OTHER PUBLICATIONS

Notification of Transmittal of the International Search Report and the Written Opinion of the International Searching Authority, or the Declaration, PCT/US2014/047957, Nov. 12, 2014, 1 page.

International Search Report, PCT/US2014/047957, Nov. 12, 2014, 3 pages.
Written Opinion of the International Searching Authority, PCT/US2014/047957, Nov. 12, 2014, 3 pages.

* cited by examiner

US 9,224,768 B2

PIN DIODE STRUCTURE HAVING SURFACE CHARGE SUPPRESSION

TECHNICAL FIELD

This disclosure relates generally to PiN diode structures and more particularly to PiN diode structures having surface charge suppression.

BACKGROUND

As is known in the art, a PiN diode includes an intrinsic semiconductor material, such as for example, silicon (Si) sandwiched between an n-doped region and a p-doped region. When the diode is reverse biased, the electric field fully depletes the intrinsic region. As a photodetector, the PiN diode is reverse biased. Under reverse bias, the diode ordinarily does not conduct (except for a small dark current or $I_s$ leakage). A photon entering the intrinsic region frees a carrier. The reverse bias field sweeps the carrier out of the region and creates a corresponding output current.

As is also known in the art, the noise performance of silicon diode (Si:PiN) photodetectors is limited by the surface leakage or dark current. Exposure to various environmental conditions such as ionizing radiation or humidity can further degrade the performance by increasing the surface leakage current. Present devices are unfortunately designed in a manner that maximizes the surface generated dark current by biasing the surface in depletion. The contribution is partially mitigated by the use of a channel stop to remove the potential minima away from the surface and by annealing to passivate interface states, but the result is still a device where the surface dark current limits the ultimate performance.

In the current art, these devices are made from single crystal Silicon. The surface of the crystal is oxidized to produce a SiO2 passivation layer. In the interface between the Silicon and the SiO2, there are inherent defects due to the mismatch between the two materials. At these defect sites there are unbonded Si orbitals that are electrically active. A normal Silicon process attempts to passivate these dangling orbitals by annealing in Hydrogen, which bonds to the defect site and reduces its electrical activity. Such Hydrogen passivation is never completely effective, so some small percent of the precursor defect sites remain electrically active where they contribute leakage current due to trapping/detrapping that occurs at the resulting recombination center.

SUMMARY

In accordance with the present disclosure a semiconductor structure is provided comprising: a silicon structure; and a plurality of laterally spaced diodes formed in the silicon structure; and a surface of the silicon structure configured to reduce reverse bias leakage current through the diodes.

In one embodiment, the surface has thereon a gate electrode structure biased to reduce reverse bias leakage current through the PiN diodes.

In one embodiment, a semiconductor structure is provided having: a silicon structure and a plurality of laterally spaced PiN diodes formed in the silicon structure. A surface of the silicon structure is configured to reduce leakage current through the diodes.

In one embodiment, the surface has thereon a gate electrode structures biased to reduce leakage current through the diodes.

In one embodiment, the PiN diodes operate in depletion.

In one embodiment, a semiconductor structure is provided having: a silicon structure; a plurality of laterally spaced PiN diodes formed in the silicon structure, each one of the diodes corresponding to one of an array of photon detector pixels; and a gate electrode structures disposed on a surface of the silicon structure, the gate electrode structure having portions disposed between adjacent pairs of the diodes, the gate structure being biased to prevent leakage current through the diodes.

In one embodiment, the PiN has a P+ region and an N+ region and the gate electrode structure has a plurality of apertures therein, each one of the apertures being disposed over a corresponding one of the P+ regions or N+ regions.

With such structure, a fully-depleted Si:PiN detector array is provided enabling integration of a surface pinned, fully-depleted PiN diode array with a conventional CMOS readout to provide a bulk-limited SCA (Sensor Chip Assembly) with very high Quantum Efficiency across the visible spectrum from 400-1000 nM. The structure suppresses surface generated dark current. More particularly, the structure fully suppresses reverse bias leakage current through the PiN diodes by Fermi band pinning the surface. As a result, the PiN diodes are limited by the bulk leakage current and have improved stability. The buried channel implant with channel stops separating pixels confines and store charge away from the surface and gate structures in the area between the diodes and the channel stop to control the surface potential. With application of an appropriate bias to the gate structures, the surface is pinned to the valence band and surface generated dark current is suppressed.

Thus, with such structure: The incorporation of a buried channel implant into a Si:PiN allows charge collection in the bulk of the material where it does not interact with the surface; The use of a gate structure allows the application of a bias which effectively pins the surface, fully suppressing surface generated dark current; The structure can be used as one of a plurality of like structures in a fully depleted Si:PiN detector array; and The structure enables integration of a surface pinned, fully depleted PiN diode array with a CMOS readout to provide a bulk-limited SCA with very high Quantum Efficiency The details of one or more embodiments of the disclosure are set forth in the accompanying drawings and the description below. Other features, objects, and advantages of the disclosure will be apparent from the description and drawings, and from the claims.

DETAILED DESCRIPTION

Figure 1:
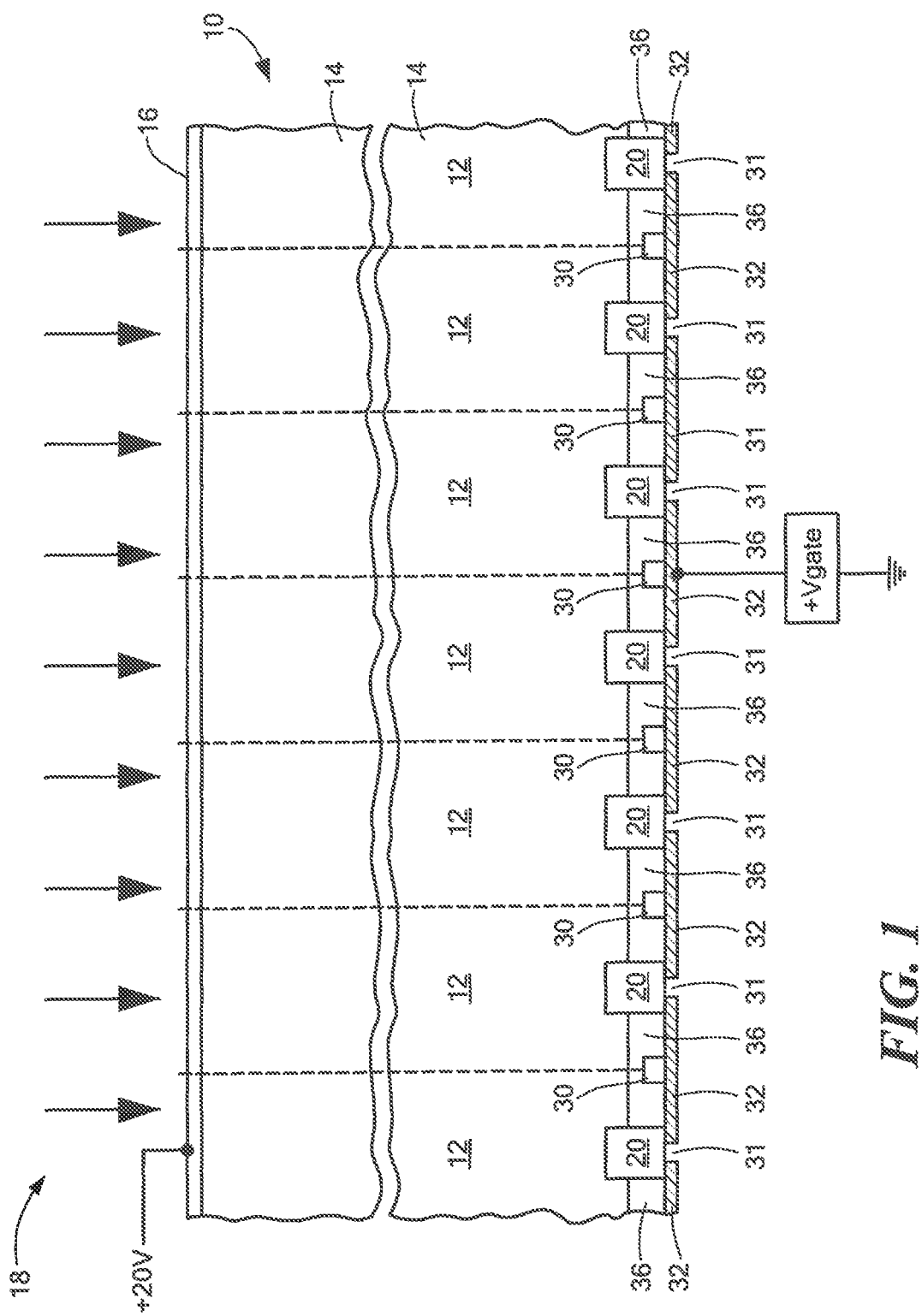
FIG. 1 is a diagrammatical, cross sectional sketch of a portion of array of photon PiN diode detectors according to the disclosure.

Referring now to FIG. 1, a portion of a semiconductor structure 10 having a plurality or array of photon detector, PIN diode pixels 12 to provide a focal plane array (FPA), is shown. The structure 10 includes an intrinsic silicon layer or body 14 having an ion implanted N+ type doped silicon layer 16 disposed in the upper surface of the intrinsic silicon layer 14. The upper surface is adapted to intercept incoming photons as indicated by arrows 18. The structure 10 includes a plurality of ion implanted type doped silicon regions 20 dispersed in laterally spaced regions in an bottom, opposite, surface of the an intrinsic Silicon layer 14. The N+ type doped silicon region 16 and the plurality of P+ type doped silicon regions 20 forming, and being biased to form, a plurality of reverse biased PiN diodes 12, each one of the PiN diodes 12 corresponding to one of the photon detector pixels 12. More particularly, the N+ layer 16 is connected to a positive potential, here for example +20 volts, and the P+ regions 20 are connected to ground or a negative potential and the CMOS readout electronics senses the current into the negative terminal either by use of a charge sensitive amplifier or by connection to the gate of a simple source follower amplifier. Thus, each one of the pixels 12 is therefore a reverse biased PiN diode 12.

The structure 10 also includes a plurality of N type silicon lightly doped channel stop regions 30, each one being disposed around the periphery of a corresponding adjacent pair of the plurality of P+ type doped silicon regions 20 to thereby electrically isolated the pixels 12.

Figure 2:
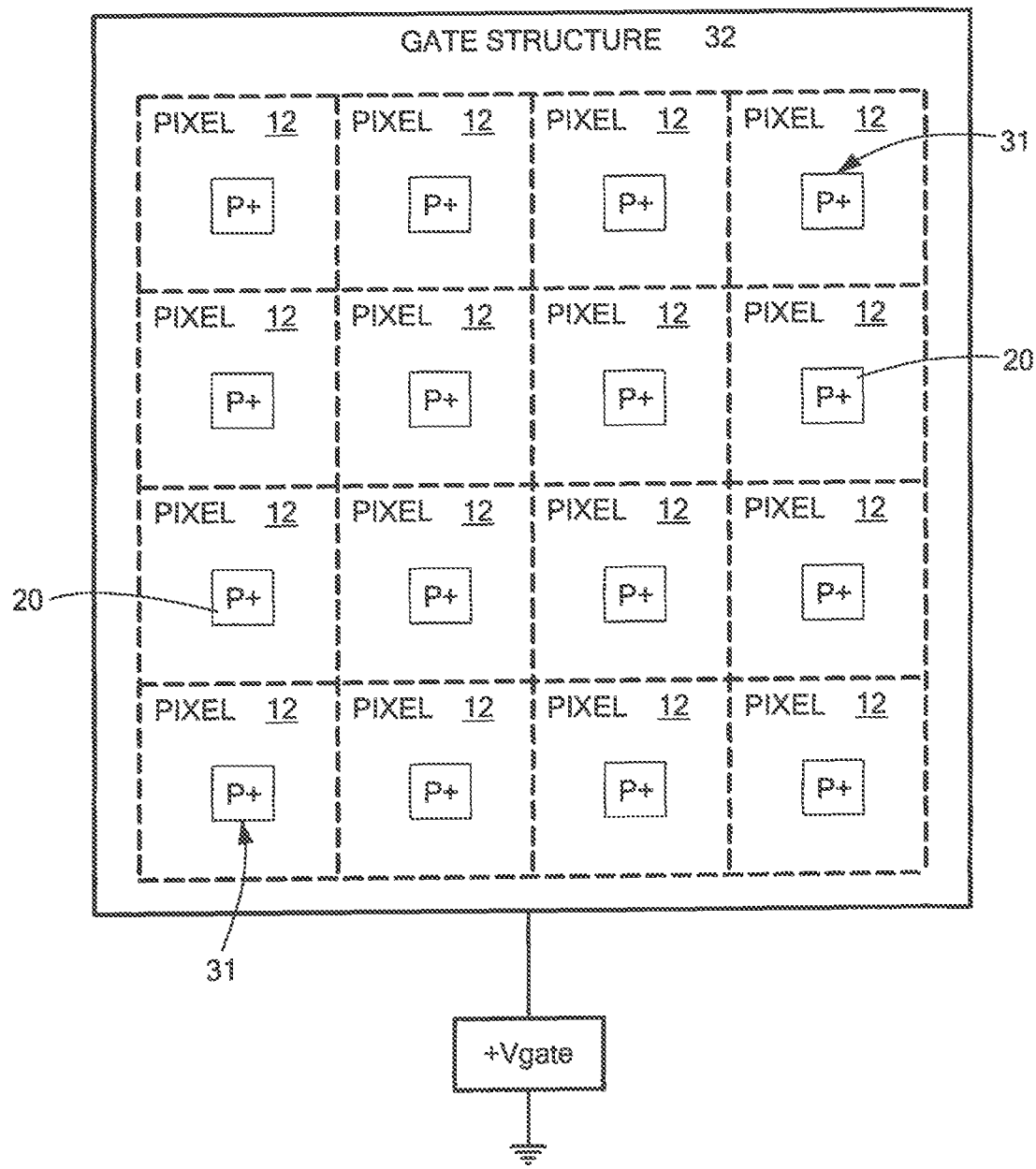
FIG. 2 is a plan view of a bottom surface of the of array of photon PiN diode detectors of FIG. 1 according to the disclosure.

The structure 10 also includes a gate electrode structure 32 disposed on said bottom surface, the gate electrode structures 32 having a plurality of apertures 31 (FIG. 2) therein, each one of the apertures 31 being disposed over a corresponding one of the P+ type doped silicon regions 20, as indicated. The gate structure 32 is formed by first growing a continuous silicon dioxide insulating layer, here for example, 500 Angstroms thick, over the bottom surface having the array of pixels, and then forming a continuous n type doped polycrystalline silicon layer on the 500 Angstrom thick insulating layer. The gate structure 32 is then masked and photolithographically processed to form aperture therein over the regions between where the P+ type doped regions 20 are to be formed. Next, P+ type dopant is ion implanted or diffused into the apertures to produce the P-doped regions 30 as shown. The gate electrode structures 32 is biased by a voltage $V_{gate}$ to control the surface potential in the area between the P+ implants, biasing the surface into either accumulation of depletion effectively pinning the surface and reducing reverse bias leakage current through the PiN diodes 12 (the leakage current between the N+ region and the P+ regions)

It is noted that the structure 10 includes a buried p-type channel 36 disposed, here ion implanted into, the bottom surface of the intrinsic silicon material 14. The bias $V_{gate}$ on the gate electrode structure 32 is selected to spatially bond channel 36 band carriers in valance bands thereof to conduction bands thereof.

A method for determining the bias voltage $V_{gate}$ to be applied to the gate electrode structure is as follows: With the upper surface of the structure 10 shielded from any incoming radiation, and with the PiN diodes reverse biased, a voltage $V_{gate\ calibrate}$ is applied to the gate electrode structure 32 with a current measuring device, such as, for example a Charge Transfer Impedance Amplifier or electrometer coupled to the P+ regions 20 to measure reverse bias leakage current through the PiN diodes 12. The applied voltage $V_{gate\ calibrate}$ is stepped through a range of voltages, as for example from +10 volts to −10 volts and at each step in voltage, the current through the P+ regions is measured. The gate voltage $V_{gate}$ is selected as that one of the stepped voltages $V_{gate\ calibrate}$ where the current through the P+ regions is minimum. This minimum can occur if the diode is biased into accumulation or inversion. Accumulation occurs typically for negative voltages where the negative charge on the gate attracts holes from the substrate to the oxide-semiconductor interface. Inversion occurs at voltages beyond the threshold voltage. In inversion, there exists a negatively charged inversion layer at the oxide-semiconductor interface in addition to the depletion-layer. This inversion layer is due to the minority carriers that are attracted to the interface by the positive gate voltage. Here, the gate voltage $V_{gate}$ is selected when the surface is biased into inversion. The bias voltage $V_{gate}$ is a constant, time invariant voltage applied to all the gate electrode structures 32 and is selected to reduce reverse bias leakage charge through the diode 12.

A number of embodiments of the disclosure have been described. Nevertheless, it will be understood that various modifications may be made without departing from the spirit and scope of the disclosure. For example, the P and N regions may be reversed with a corresponding reversal in the voltage polarity applied to them. Further, the intrinsic material between the P+ and N+ regions may be removed. Still further the gate structure may be made from individual gate structures, each one being disposed over a corresponding one of the pixels. Accordingly, other embodiments are within the scope of the following claims.

What is claimed is:

1. An array of photon detectors having a plurality of photon detector pixels, comprising:
    an intrinsic silicon layer;
    an N+ or P+ type doped silicon layer disposed in one surface of the intrinsic silicon layer, such surface being adapted to intercept photons;
    a first plurality of doped silicon regions disposed in laterally spaced regions in an opposite surface of the an intrinsic silicon layer, each one of the first plurality of doped regions having a conductivity type opposite the conductivity type of the doped silicon layer, the doped silicon layer and the first plurality of doped silicon regions forming, and being biased to form, a plurality of reverse biased PiN diodes, each one of the PiN diodes corresponding to one of the photon detector pixels;
    a second plurality of silicon doped regions each one being disposed between a corresponding adjacent pair of the first plurality of doped silicon regions, the second plurality of doped region having the same conductivity type as the doped silicon layer and a doping concentration less than the doping concentration of the doped silicon layer;
    a gate electrode structure disposed on said opposite surface, the gate electrode structure having portions disposed over the second plurality of silicon doped regions;
    a voltage source connected to the gate electrode structure having a voltage level to reduce leakage current between the doped layer and the first plurality of doped silicon regions.

2. The array of photon detectors recited in claim 1 including a channel band having the conductivity type of the first plurality of doped regions with a doping concentration less than the doping concentration of the first plurality of doped regions disposed beneath the gate electrode structures, wherein the voltage source has the voltage level to spatially bond channel band carriers in valance bands thereof to conduction bands thereof.

3. An array of photon detectors, comprising:
    a layer having an N+ or P+ type doped conductivity adapted to intercept photons;
    a plurality of doped regions disposed in laterally spaced regions under the layer, the doped regions having a conductivity type opposite to the conductivity type of the layer wherein the layer and the plurality of doped regions form a corresponding plurality of diodes, each one of the diodes corresponding to one of the plurality of photon detector pixels;

a plurality of channel stop regions, each one of the channel stop regions having the same conductivity type as the conductivity type of the layer, each one of the channel stop regions being disposed between a pair of laterally spaced doped regions, each one of the channel stop regions have a doping concentration less than the doping concentration of the layer;

a gate electrode having portions disposed on a pair of adjacent ones of the plurality of doped regions;

a voltage supply producing a voltage on the gate electrode with a level selected to suppress surface generated dark current along a surface of a pair of adjacent ones of the plurality of doped regions under the gate electrode compared with generated dark current absent the voltage.

4. The array of photon detectors recited in claim 3 wherein the voltage level is selected to bias the surface into accumulation or inversion.

\* \* \* \* \*